United States Patent [19]
Currie et al.

[11] 4,446,477
[45] May 1, 1984

[54] MULTICHIP THIN FILM MODULE

[75] Inventors: Thomas P. Currie, St. Paul, Minn.; Norman Goldberg, Dresher, Pa.

[73] Assignee: Sperry Corporation, New York, N.Y.

[21] Appl. No.: 294,100

[22] Filed: Aug. 21, 1981

[51] Int. Cl.³ ............... H01L 23/48; H01L 23/02; H01L 39/02
[52] U.S. Cl. .................................. 357/74; 357/71; 357/80
[58] Field of Search .............. 357/74 B, 74 C, 80, 357/71, 65, 68, 74; 361/396, 412, 417

[56] References Cited

U.S. PATENT DOCUMENTS 4,221,047 9/1980 Narken et al. ............ 357/80 X
4,322,778 3/1982 Barbour et al. ............ 357/74 X

FOREIGN PATENT DOCUMENTS 52-42371 1/1977 Japan ...................... 357/68

OTHER PUBLICATIONS

Honn, J. J., "Eighty Pin Package for Field Effect Transistor Chips", *IBM Tech. Discl. Bull.*, vol. 15, No. 1, p. 308, Jun. 1982.
McIntosh et al., "Packaging of Integrated Circuits", *IBM Tech. Discl. Bull.*, vol. 15, No. 6, pp. 1977–1979, Nov. 1972.

*Primary Examiner*—Martin H. Edlow
*Assistant Examiner*—J. L. Badgett
*Attorney, Agent, or Firm*—J. B. Sowell; T. J. Scott; M. M. Truex

[57] ABSTRACT

A novel thin film processing substrate is embodied into a multichip hybrid module. The processing substrate is provided with conductive vias which are arranged in an area array having the same pattern as the lead out pin vias on a base substrate. The top surface of the processing substrate is built up by thin film techniques to provide a laminate thereon comprising a ground plane and a plurality of thin film X-direction and Y-direction signal distribution lines separated one from the other by thin polyimide insulating layers. The interconnecting thin film lines and polyimide layers are built up as patterns using photolithographic techniques. The X and Y-direction conductive lines and the ground plane are selectively interconnected through the vias and each other to form a predetermined signal distribution circuit. Terminal pads are provided on both the X and Y-direction lines to permit making electrical interconnections to the integrated circuit chips which are mounted on the processing substrate thus forming a circuit pattern between the integrated circuit chips and the lead out pins on the base substrate. Bumps are provided on the top of the vias in the base or pinned substrate for connecting it to the processing substrate after the integrated circuit chips have been mounted thereon.

8 Claims, 4 Drawing Figures

MULTICHIP THIN FILM MODULE

BACKGROUND OF THE INVENTION

1. Field of the Invention

This invention relates to a packaging module for high density semiconductor chips. More particularly, the present invention relates to a thin film processing substrate embodied into a multichip hybrid module.

2. Description of the Prior Art

Integrated circuits are made very small in size to increase the speed operation of the devices and to reduce the cost of manufacture. The integrated circuit chips are provided with very small pads or exposed electrodes which are connected to larger and more stable circuit patterns or leads in a package. The leads are connected to pins which may be plugged into a printed circuit board.

One of the commercially successful packages or modules for housing integrated circuits is the dual inline package (DIP) which has two parallel rows of pins that may be plugged directly into a printed circuit board. As the number of active elements on the integrated circuit chips has been increased, there has been a corresponding increase in the requirement for the number of pins on the DIP modules to the point where problems are created with DIP modules when large scale integrated circuits (LSI) and very large integrated circuits (VLSI) are to be packaged. One of the main problems with the DIP module is that you cannot place the individual chips close enough together. When the chips cannot be placed close together, the circuits inside the module as well as the printed circuits outside of the module are so long as to create problems with delays.

Albert J. Blodgett, Jr. of IBM has suggested in an IEEE publication (see a Multilayer Ceramic Multichip Module; IEEE Transactions on Components from Hybrids and Manufacturing Technology, vol. 3, no. 4, December 1980, pages 633-637) that the interconnection density of a module can be increased through the use of a plurality of layers of ceramic substrates. This article describes a twenty-three layer ceramic substrate which includes power distribution layers, signal distribution layers and redistribution layers. The numerous ceramic layers are provided with thick film conductive patterns. Patterns on one or more surfaces are interconnected by vias between layers. When vias in adjacent layers are aligned, there is a connection between the aligned vias permitting interconnection between remote or adjacent patterns.

The multilayer ceramic module described above is first cast and then blanked in a green ceramic sheet form. The circuit pattern and metalization for the via holes is then applied to the green ceramic blank sheets which are stacked in a laminate and then sintered to join the circuit pattern on the various layers. Not only are there problems with the numerous layers which require precision alignment but the laminate must be sintered and completed before it can be tested to determine if there are any opens or breaks in the circuit patterns. Another problem with the above-mentioned multilayer ceramic substrate is that it requires eight pairs of X-Y wiring planes with interspersed impedance control layers.

The signal distribution lines of the multilayer ceramic module are made with thick film lines which are approximately five mils wide on the ceramic substrates which have a relative dielectric constant of approximately nine. For a fixed predetermined characteristic impedance, this high dielectric constant results in a higher line capacitance which is undesirable because it introduces excessive and undesirable signal delays.

Another undesirable effect of having the high relative dielectric constant is that it reduces the propagation speed of the signals.

Accordingly, it would be desirable to decrease the capacitance of the lines, to increase the speed of propagation of the signals in the signal distribution layers of a module, and to reduce the number of layers and complexity of the prior art modules.

SUMMARY OF THE INVENTION

It is a principal object of the present invention to provide a novel multichip module having a processing substrate therein.

It is another principal object of the present invention to provide a novel thin film processing substrate to which the integrated circuit chips may be connected before the processing substrate is incorporated into the novel module.

It is another object of the present invention to provide a novel processing substrate which has only two signal distribution layers and yet provides adequate interconnecting circuit patterns for a plurality of integrated circuit chips.

It is yet another object of the present invention to provide a novel processing substrate having signal distribution lines formed on relatively low dielectric constant polyimide insulating layers.

It is another object of the present invention to provide a substrate which has an area array of lead out pins.

It is another object of the present invention to provide a novel multichip module which is cheaper to make, results in higher yields of modules and has faster signal propagation characteristics.

It is a general object of the present invention to provide a novel processing substrate on which thin film processing steps may be performed prior to integrating the processing substrate into a multichip module.

According to these and other objects of the present invention to be discussed in detail hereinafter, there is provided a processing substrate adapted to be enclosed into a module comprising a base or pinned substrate and a top cover. The processing substrate is provided with vias which are arranged in an array having the same pattern as the lead out pin vias in the base substrate. The top surface of the processing substrate is built up by thin film techniques into a laminate comprising a ground plane and a plurality of thin film X-direction and Y-direction signal distribution lines separated one from the other by thin polyimide insulating layers. The interconnecting lines and polyimide layers are patterned by photolithography. The X and Y direction lines, the ground plane and vias are selectively interconnected to each other to form a predetermined signal distribution pattern. Terminal pads are provided on both the X and Y direction lines for making connections to the integrated circuit chips. Thus forming a circuit pattern between chips and the lead out pins. Bumps are provided on the top of the vias in the pinned substrate for connecting it to the processing substrate after the integrated circuit chips have been mounted thereon.

DESCRIPTION OF THE PREFERRED EMBODIMENT

Figure 1:
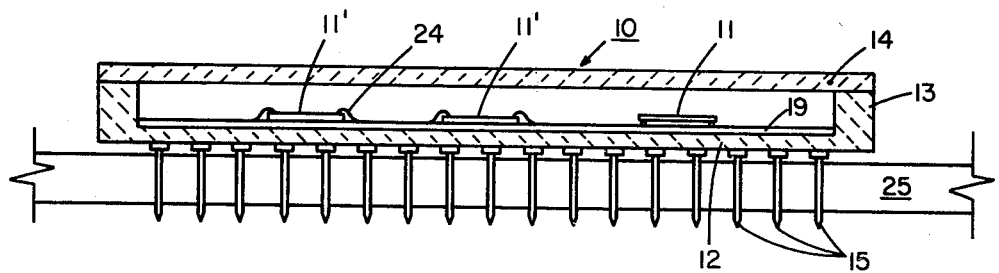
FIG. 1 is an elevation in cross-section showing the novel multichip thin film module.
Figure 2:
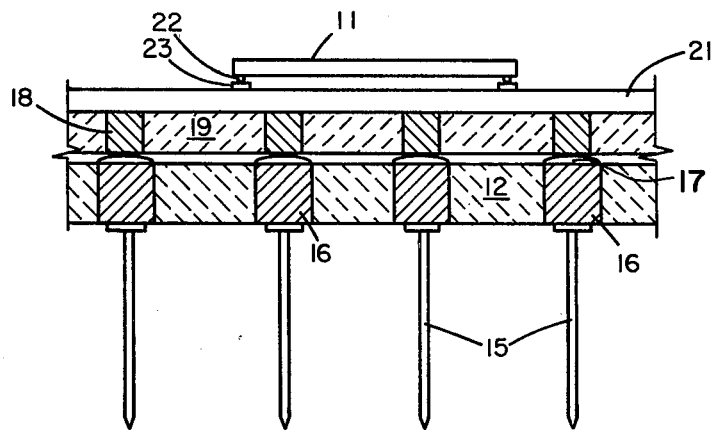
FIG. 2 is an enlarged elevation in partial section showing the location of the base or pinned substrate and the processing substrate relative to an integrated circuit which is mounted thereon.

Refer to FIGS. 1 and 2 showing a module 10 which is a rectangular shaped package containing a plurality of chips 11 or 11'. The module 10 comprises a base or pinned substrate 12 having a raised edge 13 adapted to be connected to a cap or top substrate 14. Preferably, the base substrate 12 and top substrate 14 are made of a dense aluminum oxide to provide a rigid heat conducting package which is hermatically sealed by known means.

Lead out pins 15 are connected to vias 16 in the bottom of pinned substrate 12. As will be explained in detail hereinafter, the pins are preferably arranged in a rectangular array and spaced about one-tenth of an inch apart. Vias 16 is base substrate 12 are preferably molybdenum or tungsten or alloys thereof which provides a hermatic seal with the ceramic substrate. The top of vias 16 in substrate 12 are provided with solder bumps 17 which form an electrical connection with vias 18 in processing substrate 19. Since the low melting temperature bumps 17 are provided on vias 16 of the base substrate, the processing substrate 19 may be completed separate and apart from the base substrate 12 and then connected to the base substrate 12. When the vias 18 of processing substrate 19 are axially aligned with bumps 17 and vias 16, a reflow solder connection may be made by heating the assembly as is well known in the art.

Processing substrate 19 is a flat rectangular blank sheet in which vias 18 have been provided. The pattern of vias 18 is identical to the pattern of vias 16 in the base or pinned substrate 12. As will be explained with reference to FIGS. 3 and 4, a plurality of thin film layers are deposited on top of the processing substrate 18 to provide a thin film signal distribution layer or laminate 21 to which chips 11 or 11' are connected. Chips 11 are provided with bumps 22 which are connected to terminal pads 23 that are provided on the upper or top layer of laminate 21 as will be explained. Chips 11' may be provided without bumps 22. Wire bonds 24 connect the terminal pads on chips 11' to the pads 23 exposed at the top of the laminate layer 21. The laminate layer 21 provides a distribution circuit pattern or patterns which will interconnect chips 11 and 11' with each other and with the lead out pins 15.

After the module 10 is complete, it is adapted to be plugged into a multilayer glass-epoxy printed circuit card or board 25 of the type having etched foil printed circuits thereon and therein.

Before explaining the advantages of the present novel processing substrate 19 and laminate layer 21 which is built up on top of substrate 19, it should be observed that prior art thick film circuit lines are about five mils wide and about one to two mils thick. The thick film lines are placed on green ceramic substrates which are eight to twelve mils thick. A stack of ten such layers would create a signal distribution layer approximately eighty to one hundred twenty mils thick. The ceramic layers have a relative dielectric constant of about 9.4.

The present invention processing substrate 19 is preferably about twenty mils thick and the laminate layer 21 which forms the signal distribution layer is about one mil thick. Preferably, the width of the thin film lines are only five to thirty micrometers wide and about one to six micrometers thick after being plated. The insulation layers or dielectric layers between the conductive layers are about five to fifteen micrometers thick. In the preferred embodiment processing substrate a DUPONT PI2555 polymer was laid down by spin casting to provide a thin film insulation layer five to fifteen micrometers thick. This polyimide layer has a relative dielectric constant of 3.5 and when incorporated in the laminate signal distribution layer 21 provides an effective dielectric constant of 2.33. One mil is twenty-five micrometers, thus, the thin film conductive lines are about one-tenth as wide as thick film lines. The novel thin film lines can be placed much closer together. When the lines are placed much closer together, the number of interconnecting planes can be reduced. It has been found that VSLI hybrid modules can be interconnected with one X and one Y-direction signal plane.

Figure 3:
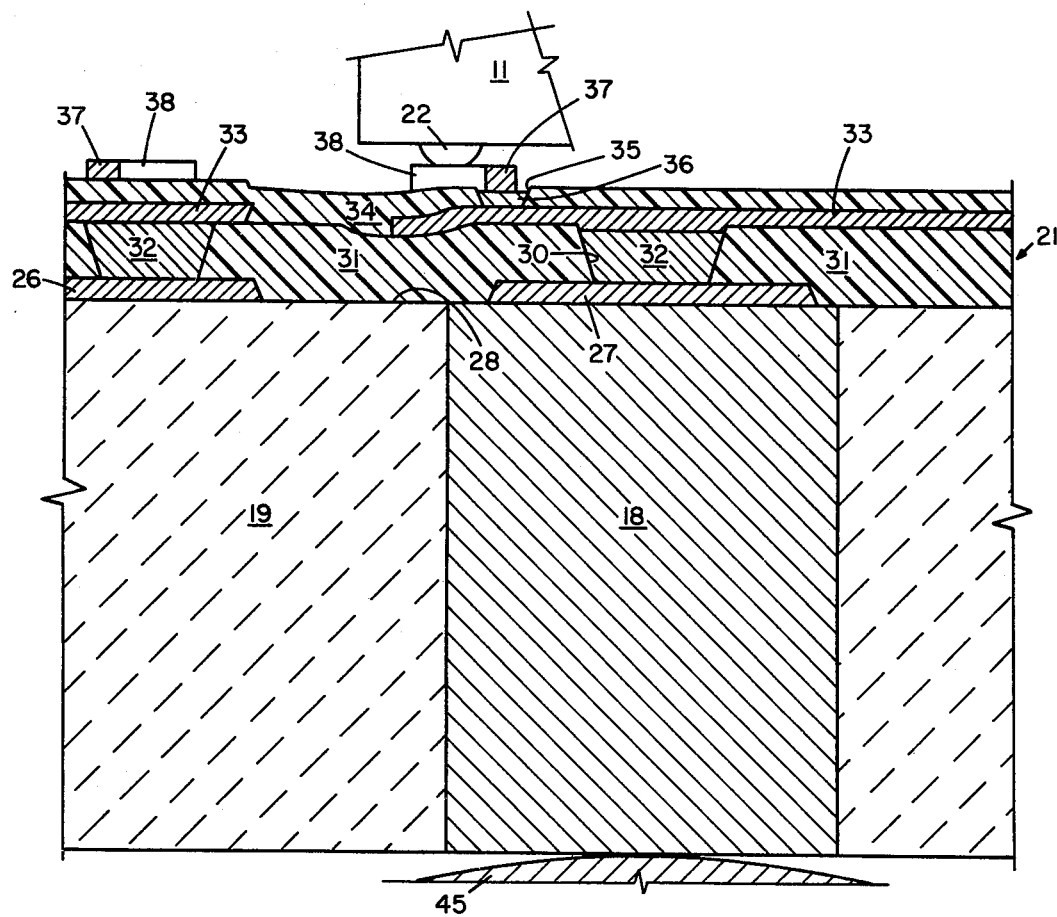
FIG. 3 is a more enlarged elevation in partial section of a portion of the processing substrate showing a metal via and details of the thin film layers deposited thereon which form signal distribution lines.
Figure 4:
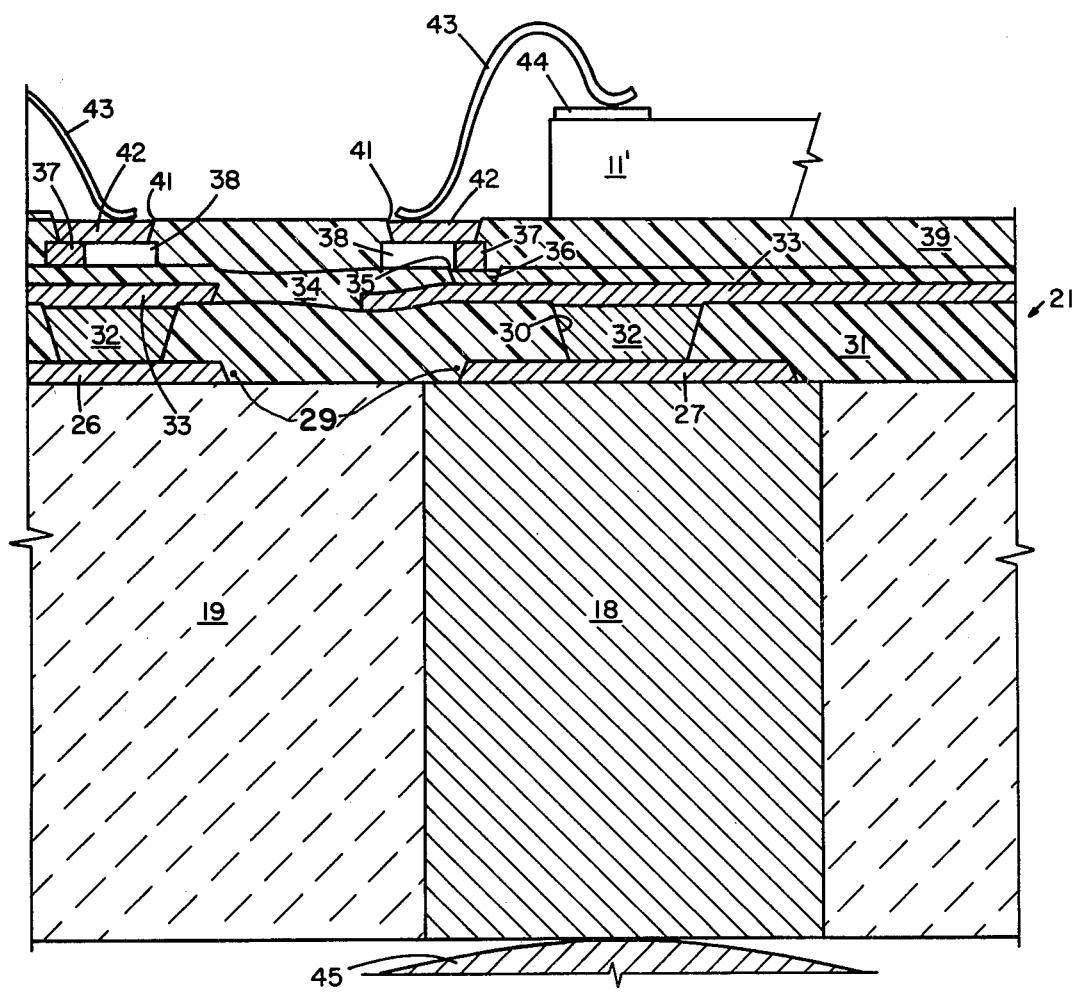
FIG. 4 is a modified embodiment of the processing substrate shown in FIG. 3 adapted to receive chips which are wire bonded to the pads on the processing substrate.

Refer now to FIGS. 3 and 4 showing in detail the layers that are built up on the processing substrate 19. Ceramic substrate 19 is preferably made from a thin sheet of rectangular shaped aluminum oxide (alumina) which is fired after having an array of via holes punched therein and filled with a metallic paste to form conductive vias 18. The top surface of substrate 19 is polished flat to enhance the photolithographic steps to be employed to build up the signal distribution layers 21.

A conductive ground plane 26 and a conductive cap 27 are formed on the top surface 28 of processing substrate 19. Preferably, photoresist and chemical etching is employed to form the resulting etch pattern in which conductive cap 28 is surrounded by an annular insulation ring 29 only one-tenth of one millimeter wide. The conductive vias 18 shown in FIGS. 3 and 4 are preferably only four-tenths of one millimeter in diameter, thus the outside diameter of the insulating ring 29 is approximately six-tenths of one millimeter in diameter and the remainder of the surface forms the ground plane. A first layer of polyimide insulating material 31 is laid down in a uniform thickness by a series of spin casting operations followed by imidization at three hundred fifty degrees Fahrenheit to set the polyimide insulation layer. Apertures 30 are then formed in the polyimide insulation layer 31 by liquid etching or plasma etching using an appropriate mask or shield. The apertures 30 are then filled with conductive metal 32 preferably by electrodeposition. The filled apertures 30 form electrical connections to the ground plane 26 and/or to the conductive caps 27 on vias 18.

X-direction conductive lines 33 are formed as thin film conductive pattern lines on top of the substantially smooth first layer of insulation 31. While only one set of X-direction lines 33 are shown, it will be understood that a plurality of such lines are formed parallel to each other. As will be explained hereinafter, the parallel lines are preferably separated one from the other approximately four line widths. The conductive lines 33 need not all extend continuously across the substrate 19, but should form electrical access to the vias 18, to the ground plane 26 and extend to other chips 11, 11' which are mounted on the same substrate 19.

The X-direction conductive lines 33 are covered with a second layer of polyimide insulation 34 also preferably applied by spin casting on the substrate. The uniformley thin cast layer of liquid insulation material is dried and set by the afore-mentioned imidizing process. If the process is maintained clean and without contaminants, the two insulation layers 31 and 34 form as a single layer The second insulation layer 34 is now etched to produce small via holes 35 which are filled with conductive metal 36, preferably by electroplating.

Y-direction conductive lines 37 are now applied on top of the second insulation layer 34 employing thin film application techniques. The Y-direction conductive lines 37 and the X-direction conductive lines 33 are preferably only about five to thirty micrometers wide and spaced about four times their width apart. The flat thin film X and Y-direction lines 33, 37 act more nearly like microstrip transmission lines because the ground plane 26 substantially covers the top surface 28 of substrate 18. The longest interconnecting conductive line will be approximately one hundred eighty millimeters. The propagation time for signal transmission by a TEM mode signal is directly proportional to the square root of the relative dielectric constant. The polyimide insulating layer has a relative dielectric constant of 3.5, therefore, the longest propagation time for signals between points on the substrate will be approximately one nanosecond. This is a substantial improvement over the prior art thick film signal distribution layers which comprise a plurality of patterns stacked one upon the other with an insulating layer with a dielectric constant of about 9.0.

Terminal bonding pads 38 are preferably formed at the same time the Y-direction lines 37 are formed. The bonding pads 38 and lines 37 are plated as mentioned hereinbefore so that bonding wires or bumps 22 on chips 11 may be attached thereto by flip-chip bonding techniques.

FIG. 3 shows a typical flip-chip of the type having bumps 22 on the chip face. Such flip-chips require that all of the bumps 22 be oriented on their pads 38 when the chip 11 is face down and bonded.

The laminate layer 21 as shown in FIG. 4 is substantially identical to the structure shown in FIG. 3 with the exception that a third or top insulation layer 39 is applied on top of the second insulation layer 34. This polyimide insulation layer 39 is applied by spin casting techniques. Apertures 41 are then made in the third insulation layer 39 so as to expose the bonding pads 38. Additional conductive material 42 can be applied in the apertures 41 to build up the bonding pads 38. Since the insulation layer 39 is only about five micrometers in thickness, the step down to bonding pads 38 is not usually great enough to effect the ability of the wire bonder to bond wire 43 to the pad 38 without having to build up a conductive metal layer 42. There is an advantage to having a conductive metal layer 42 deposited on the bonding pad 38 in that a desired type of metal such as gold may be put on top of the pad 38 so that the conductive metal pad 42 is compatible with the metal of the bonding wire 43 which will result in stronger bonds being made by the wire bonder in a lesser amount of time.

Bonding wire 43 is attached to terminal pads 44 on chip 11'. It will now be understood that any terminal pad 44 on chip 11' can be connected to a Y-direction conductive line 37 which in turn may be connected to an X-direction conductive line 33 by conductive metal 36 formed in apertures 34. As shown in FIG. 4, the other Y-directional line 37 is provided with a bonding pad 38 and a conductive metal layer or deposit 42 to which a different bonding wire 43 is attached. This other Y-direction conductive line 37 is not shown connected to any X-direction conductive line 33. This line 37 may connect its bonding wire 43 to the ground plane 26. Thus, it will be understood that the chips 11, 11' may be placed on the laminate layer 21 which is built up on processing substrate 19 to provide a signal distribution layer 21 deposited by thin film techniques. It has been determined that enough X and Y-direction conductive lines 33, 37 can be deposited and formed in a single laminate layer 21 to provide an adequate number of interconnecting lines to properly connect chips 11 and 11' and provide proper lead out lines.

After all of the interconnecting lines, bumps 22 and wires 43 have been properly attached, the completed processing substrate 19 is now ready to be attached to the base substrate 12. In order to attach the completed substrate 19 to the base substrate 12 there are provided bumps 45 on the top of vias 16. These bumps 45 may be made by plating a suitable thin layer and then forming the solder bumps 45 thereon. The completed substrate 19 is now placed on top of the base substrate 12 with the vias 18 of processing substrate 19 in registration with the larger diameter vias of the base substrate 12. A reheating or reflow of the solder bumps 45 will provide proper connection between the substrates 19 and 12.

Having explained how a novel thin film substrate 19 may be made, it will be understood that the module 10 may be made smaller and that there is an increased density of the interconnecting lines which reduces the normal propagation delays and capacity of loading of the interconnections. Further, it will be understood that the substrate 19 was made substantially flat and without attachment pins 15 so that the thin substrate 19 could be treated as a semiconductor wafer and process using semiconductor thin film techniques on the top of the substrate which could not ordinarily be performed if the processing substrate 19 had lead out pins thereon. Further, the processing substrate may be inspected at several different stages of its process and easily repaired before the expensive chips 11, 11' are applied to the distribution layer 21. It is also apparent that means can be provided on the processing substrate so that its interconnecting lines may be checked before being incorporated into the module. For example, the conductive vias 18 at the bottom of processing substrate 19 are easily accessible by standard and commercially available semiconductor probing devices which may be connected to testing means for testing the actual circuit before it is incorporated into module 10.

Having explained a preferred embodiment design module 10 it will now be appreciated that a large number of lead out pins 15 may be accomodated on the bottom of base substrate 12 so as to permit the building of hybrid modules incorporating VLSI chips. The standard area pin grid array on the bottom of base substrate 12 permits the new modules to be incorporated into production equipment having standard area pin spacing for insertion into state-of-the-art printed circuit boards 25.

We claim:

1. A multichip thin film module for hybrid packaging of semiconductor devices, comprising:

a single layer ceramic base substrate, an array of via holes extending through said base substrate, sealed conductive vias in said array of via holes in said base substrate, lead out pins connected to said vias in said base substrate, a top cover sealed to said base substrate forming a closed package therewith, a ceramic processing substrate adapted to be completed before being placed in said closed package, said processing substrate having a uniform flat top surface, an array of via holes extending through said processing substrate having the same array pattern as the via holes in said base substrate, conductive vias in said array of via holes in said processing substrate forming an extension of said sealed conductive vias, a conductive ground plane pattern formed on the top surface of said processing substrate leaving annular insulating rings around the top of said conductive vias, a first insulating layer formed over said ground plane and said conductive vias in said processing substrate, apertures in said first insulating layer forming a predetermined pattern of openings exposing contact areas of said ground plane and said conductive vias in said processing substrate, a first plurality of thin film conductive pattern lines on said first insulating layer, said conductive pattern lines being photolithographically formed as a pattern of X-direction line closely spaced one to another, some of said X-direction lines being connected to said conductive vias in said processing substrate and some others of said lines being connected to said ground plane and yet others of said lines being adapted to form wiring interconnection lines between semiconductor devices, a second insulating layer formed over said X-direction lines, apertures in said second insulating layer forming access to some of said X-direction lines, a second plurality of thin film conductive pattern lines on said second insulating layer, said conductive pattern lines being photographically formed as a pattern of Y-direction lines closely spaced one to another, some of said Y-direction lines being connected to said X-direction lines and some of Y-direction lines being adapted to form wiring interconnection lines between semiconductor devices, pads connected to some of said X-direction lines and some of said Y-direction lines adapted to be connected to said semiconductor devices, semiconductor devices connected to said pads to form a circuit therewith, and means for connecting said vias in said processing substrate with said vias in said base substrate to connect said circuit to said lead out pins to form a module therewith.

2. A multichip thin film module as set forth in claim 1 wherein said means for connecting said vias in said processing substrate with said vias in said base substrate comprise solder bumps.

3. A multichip thin film module as set forth in claim 2 wherein said solder bumps are formed on the top of said vias in said base substrate and connected to the bottom of said vias in said processing substrate by solder reflow heating.

4. A multichip thin film module as set forth in claim 2 wherein said solder bumps are formed on the bottom of said vias in said processing substrate and connected to the top of said vias in said base substrate by solder reflow heating.

5. A multichip thin film module as set forth in claim 1 which further includes, a third insulation layer over said Y-direction lines.

6. A multichip thin film module as set forth in claim 1 wherein said thin film X-direction and Y-direction lines are five to thirty microns in width and one to ten microns in thickness.

7. A multichip thin film module as set forth in claim 6 wherein said X-direction and Y-direction lines comprise a thin layer approximately one micron thick established by sputtering or vacuum deposit.

8. A multichip thin film module as set forth in claim 7 wherein said X-direction and Y-direction lines further comprise a plated layer up to nine microns thick formed on said thin layer.

* * * * *